United States Patent
Speer et al.

(10) Patent No.: US 10,134,714 B2
(45) Date of Patent: Nov. 20, 2018

(54) FLEXIBLE CIRCUIT BOARD FOR LED LIGHTING FIXTURES

(71) Applicants: Richard Speer, Concord, MA (US);
David Hamby, Andover, MA (US);
John Selverian, North Reading, MA (US)

(72) Inventors: Richard Speer, Concord, MA (US);
David Hamby, Andover, MA (US);
John Selverian, North Reading, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 106 days.

(21) Appl. No.: 14/075,142

(22) Filed: Nov. 8, 2013

(65) Prior Publication Data
US 2015/0129909 A1 May 14, 2015

(51) Int. Cl.
*H01L 33/00* (2010.01)
*H01L 29/205* (2006.01)
(Continued)

(52) U.S. Cl.
CPC .......... *H01L 25/0753* (2013.01); *H01L 33/60* (2013.01); *H01L 33/62* (2013.01);
(Continued)

(58) Field of Classification Search
CPC .................. H01L 33/62; H01L 33/486; H01L 2224/48091; H01L 33/32; H01L 33/38;
(Continued)

(56) References Cited

U.S. PATENT DOCUMENTS

| 7,446,347 | B2 | 11/2008 | Bogner et al. | |
| 2008/0062688 | A1* | 3/2008 | Aeling | H05K 1/11 362/241 |

(Continued)

FOREIGN PATENT DOCUMENTS

| DE | 102010049333 A1 | 4/2012 |
| EP | 0677695 A2 | 10/1995 |
| EP | 1473978 A1 | 3/2004 |

OTHER PUBLICATIONS

Patent Abstract of German Publication No. DE102010049333, Publication Date Apr. 26, 2012, downloaded from Espacenet, 1 page.

(Continued)

*Primary Examiner* — Thao X Le
*Assistant Examiner* — Nduka Ojeh
(74) *Attorney, Agent, or Firm* — Edward S. Podszus (57) ABSTRACT

Techniques are disclosed for making a flexible laminated circuit board using a metal conductor onto which a SMD may be attached. Conductive metal strips may be laminated to form a flexible substrate and the metal strips may then be perforated for the placement of LED package leads. The LED packages may be attached to the conductive strips using solder or a conductive epoxy and the upper laminate layer may include perforations exposing portions of the metal strips for the attachment of the LED packages. Alternatively, strings of LED packages may be fabricated by attaching LED packages to conductive strips and these strings may be laminated between flexible sheets to form a laminated LED circuit. Plastic housings may aid in attaching the LED packages to the conductive strips. The plastic housings and/or the laminate sheets may be made of a reflective material.

19 Claims, 8 Drawing Sheets

(51) Int. Cl.
  H01L 25/075 (2006.01)
  H01L 33/60 (2010.01)
  H01L 33/62 (2010.01)
  H05K 3/10 (2006.01)
  H05K 1/02 (2006.01)
  H05K 1/18 (2006.01)

(52) U.S. Cl.
  CPC ............ H05K 1/189 (2013.01); H05K 3/103 (2013.01); *H01L 2924/0002* (2013.01); *H01L 2933/0016* (2013.01); *H01L 2933/0033* (2013.01); *H01L 2933/0058* (2013.01); *H01L 2933/0066* (2013.01); *H05K 1/0274* (2013.01); *H05K 1/0287* (2013.01); *H05K 1/181* (2013.01); *H05K 2201/1028* (2013.01); *H05K 2201/10106* (2013.01); *H05K 2201/2054* (2013.01); *H05K 2203/063* (2013.01)

(58) Field of Classification Search
  CPC ........... H01L 2924/01079; H01L 33/54; H01L 2924/12041
  USPC ...... 257/79–103, E33.056, E33.066; 438/22, 438/26, 27
  See application file for complete search history.

(56) References Cited

U.S. PATENT DOCUMENTS

| | | | |
|---|---|---|---|
| 2008/0191220 A1* | 8/2008 | Daniels | H01L 24/29 257/88 |
| 2008/0295327 A1 | 12/2008 | Aeling et al. | |
| 2010/0008090 A1* | 1/2010 | Li | F21V 17/007 362/249.03 |
| 2012/0068622 A1* | 3/2012 | Ward | H05K 1/189 315/294 |
| 2012/0241806 A1* | 9/2012 | Kim | H01L 25/167 257/99 |

OTHER PUBLICATIONS

Patent Abstract of EP Publication No. EP0677695, Publication Date Oct. 18, 1995, downloaded from Espacenet, 1 page.
Kellner, Alexandra, International Search Report and Written Opinion of the International Searching Authority, dated Feb. 19, 2015, pp. 1-12, European Patent Office, Rijswijk.

* cited by examiner

FLEXIBLE CIRCUIT BOARD FOR LED LIGHTING FIXTURES

FIELD OF THE DISCLOSURE

This disclosure relates to circuit fabrication, and more specifically to flexible circuit board fabrication and circuits produced therefrom.

BACKGROUND

In circuit fabrication, surface mount devices (SMD) may be attached to a printed circuit board, and in some cases the circuit board may be a flexible circuit board. Effectively attaching SMDs to flexible circuit boards involves a number of non-trivial challenges.

DETAILED DESCRIPTION

Techniques are disclosed for making a flexible laminated circuit board using a metal conductor onto which a surface mount device (SMD) may be attached. In one example, LED packages are attached to multiple metal conductors that are laminated between two laminate sheets, forming a flexible LED circuit. The LED packages may be attached prior to laminating the conductive metal strips or after the strips are laminated within the flexible circuit board. The metal strips may be perforated using a hole punching mechanism, precision blades, or some other metal-cutting technique for the placement of LED package leads. The LED packages may be attached to the conductive strips using solder or a conductive epoxy and the upper laminate layer may include perforations exposing portions of the metal strips for the attachment of the LED packages. Strings of LED packages may be fabricated, in some embodiments, by attaching LED packages to conductive strips and these strings may be laminated between flexible sheets to form a laminated LED circuit. Plastic housings may aid in attaching the LED packages to the conductive strips, and these housings may help hold the strips together when they are perforated prior to attaching the LED packages. The plastic housings and/or the laminate sheets may be made of a reflective material.

General Overview

As previously explained, flexible substrates with screen printed circuit patterns are used to fabricate flexible circuits. In some cases the circuits may be printed using a silver ink, or other conductive ink. However, in the attachment of LED packages to the flexible substrates, conductive epoxies used to attach the SMDs to the printed circuit may fail due to adhesions problems with the substrate which is typically polyester (PET). More specifically, the joint holding, for example, a 5 mm×3 mm LED package may fail because before the conductive epoxy is cured, the epoxy may cause the silver trace of the printed circuit to remove from the PET substrate.

Thus, in accordance with an embodiment of the present invention, techniques are disclosed for making a flexible laminated circuit board using a metal conductor onto which a SMD may be attached. A base metal, such as copper, would not pose the adhesion problems associated with attaching an SMD to a printed circuit. In one application, a light engine that uses a laminated circuit structure may be manufactured using the techniques described herein. The metallic conductor may be, for example, gold, aluminum, silver, copper, or any other suitable conductive material. In one example embodiment, a light engine uses a flexible laminated circuit structure to assemble an LED array for area lighting fixtures. The spacing of the LEDs within the LED circuit could be determined, for example, by the spacing of the final application. For example, one might have a roll of PET with twelve strips of copper laminated within it each one inch apart. The LED packages might be spaced every inch producing a 12×12 array about one square foot for an overhead area light module, in one example. The LED packages in each strip would be in series, and the driver would be designed to accommodate that voltage, with each strip in parallel to one another, in some embodiments.

In another embodiment, a plastic housing may be molded directly onto a copper ribbon and LED packages may be attached within the housing. In some such embodiments, the plastic housing is molded from a reflective polymer. The spacing of the housings along the length of the copper ribbon would be determined by the layout of the light engine in the luminaire, in some embodiments. For example, similar to the example described above, twelve plastic housings may be molded onto twelve one-foot sections of copper ribbon. The copper ribbon within the housings may be perforated and LED packages may be attached making twelve strings of LED packages. These twelve strings of LED packages may then be laminated within a roll of PET, producing a 12×12 array about one square foot for an overhead area light module, in one example. Other lengths and numbers of LED packages are possible, and the length may be chosen based on the desired DC voltage that the lighting driver will apply across the string, in some embodiments.

As will be appreciated, the techniques disclosed may be used to laminate various circuit grids within flexible laminate sheets, as well as for the attachment of any SMD onto a flexible laminated circuit. For ease of description, however, examples are provided for fabricating a flexible LED lighting circuit with strings of LED packages.

Flexible Laminated Circuit Board Examples

Figure 1:
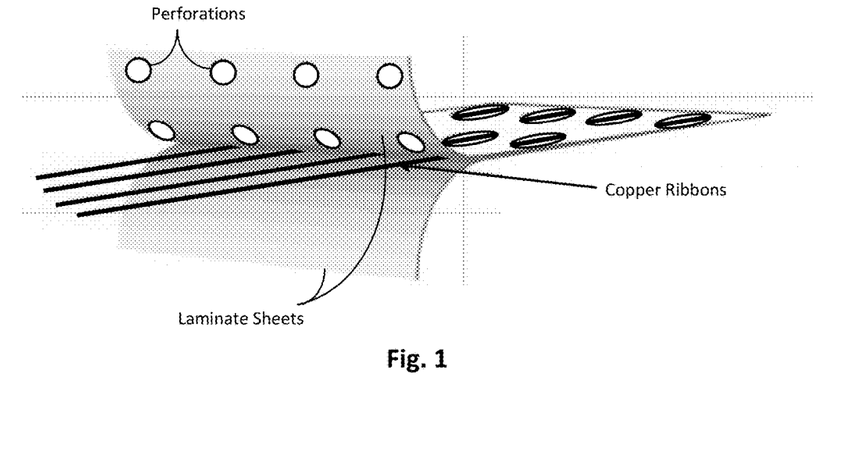
FIG. 1 shows four copper ribbons being laminated between two laminate sheets, according to an embodiment of the present invention.

FIG. 1 shows four copper ribbons being laminated between two sheets, according to an embodiment of the present invention. In this particular example, the upper laminate sheet includes perforations placed for the eventual location of LED packages on the copper ribbon. As can be seen, the perforations in this example are circular; however, they may be oval, rectangular, or any other suitable shape, in other embodiments. In one example embodiment, the upper laminate sheet is a transparent plastic such as polyethylene terephthalate (PET), or other suitable polymer, while the lower laminate sheet has a reflective upper surface. In other embodiments, the upper laminate sheet may have a reflective upper surface. Although this particular example shows four copper ribbons laminated between two sheets, other embodiments may include fewer or more copper ribbons and the copper ribbons may be replaced with copper wires, or any other suitable conductive material. In some cases, the thin copper ribbon may be around 0.003 inches thick.

Figure 2A:
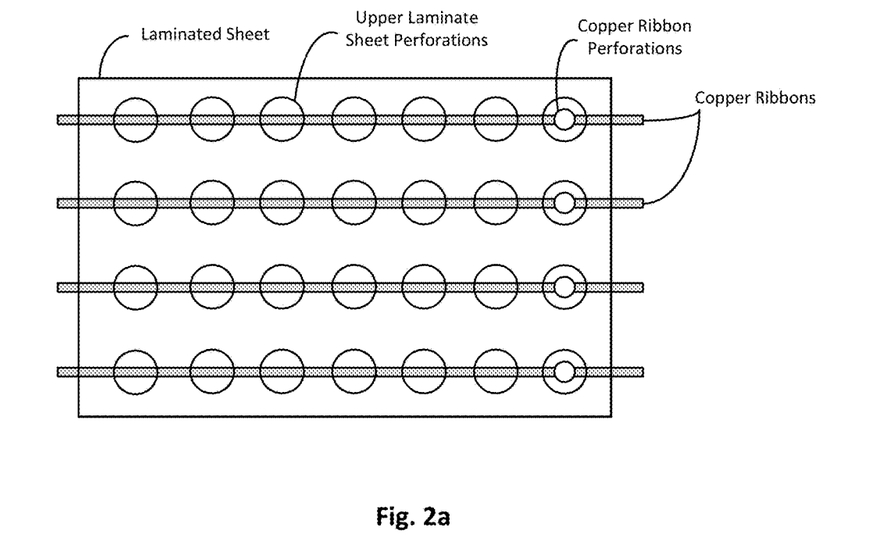
FIG. 2a shows an example flexible laminated circuit board with perforations in the copper ribbons, according to an embodiment of the present invention.

FIG. 2a shows an example flexible laminated circuit board with perforations in the copper ribbons, according to one embodiment of the present invention. As can be seen in this particular embodiment, the laminated sheet includes four copper ribbons and the upper laminate sheet has multiple perforations exposing portions of the copper ribbons for the eventual placement of LED packages. The upper laminate sheet in this particular embodiment is transparent and the entire copper ribbons are visible. As can be seen in this example, at the right of the laminated sheet each of the four copper ribbons has been perforated for the eventual placement of the anode and cathode leads of the LED packages. In this particular example, the perforation is made using a hole-punching mechanism; however, precision blades or other techniques may be used to sever the copper ribbons.

Figure 2B:
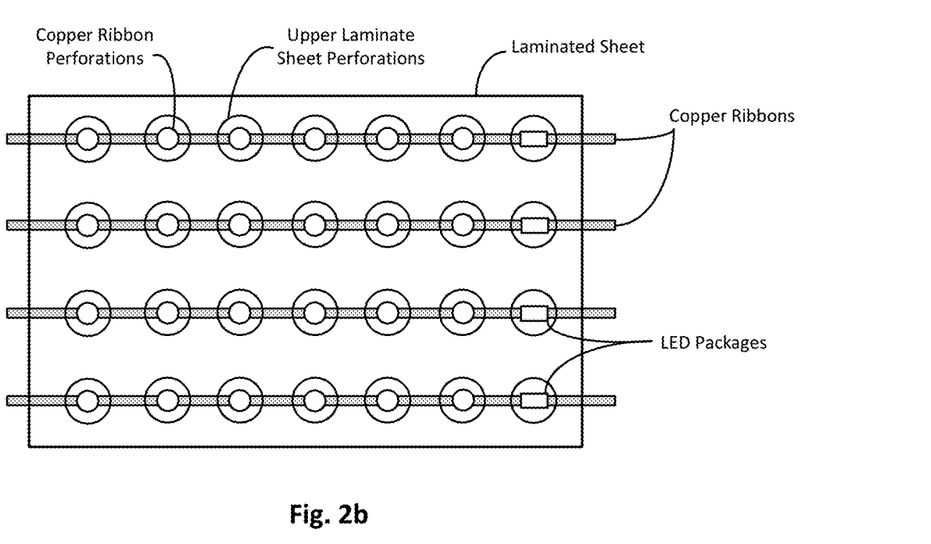
FIG. 2b shows an example flexible laminated circuit board with perforations in the copper ribbons and a number of LED packages placed across the perforations, according to an embodiment of the present invention.
Figure 2C:
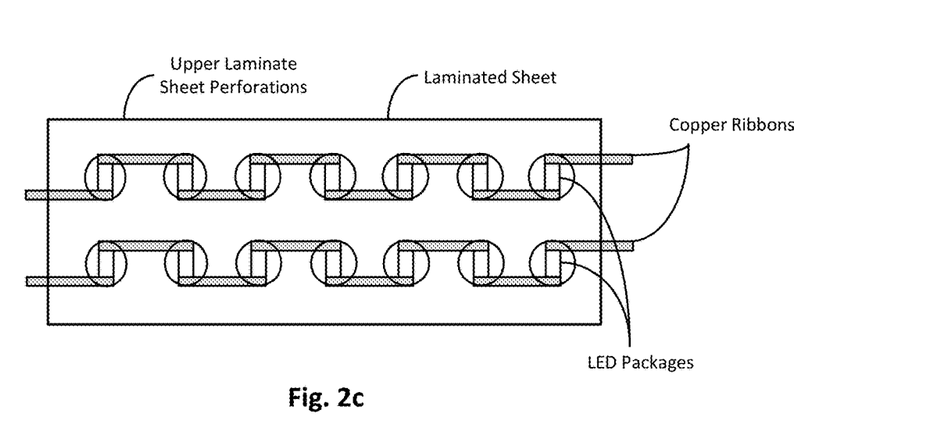
FIG. 2c shows an example flexible laminated circuit board with perforations in the copper ribbons and a number of LED packages placed across the perforations, according to another embodiment of the present invention.

FIG. 2b shows an example flexible laminated circuit board with perforations in the copper ribbons and a number of LED packages placed across the perforations, according to one embodiment of the present invention. As discussed in reference to FIG. 2a, the laminated sheet in this example embodiment includes four copper ribbons and the upper laminate sheet has multiple perforations exposing portions of the copper ribbons for the eventual placement of LED packages. The upper laminate sheet in this particular embodiment is transparent and the entire copper ribbons are visible. As can be seen in this example, at the right of the laminated sheet an LED package has been placed across a perforation of each of the four copper ribbons. The LED packages may be attached using a conductive epoxy or solder, in some embodiments. Because the LED packages are being attached to a metallic conductive wire (a copper ribbon in this example), solder may be used in order to avoid the difficulties associated with conductive epoxies. FIG. 2c shows another example flexible laminated LED circuit board wherein the series string of LED packages has LED packages connected sideways, or in a serpentine configuration, according to an embodiment of the present invention. In this particular example, the flexible laminated LED circuit board includes only two series strings of LED packages, and the sideways connection of the LED packages helps to minimize the stresses on the connections if the substrate is bent. In one such example, the sideways connection relaxes the tolerance on the length of the conductive strip decreasing any shorting worries.

Figure 3:
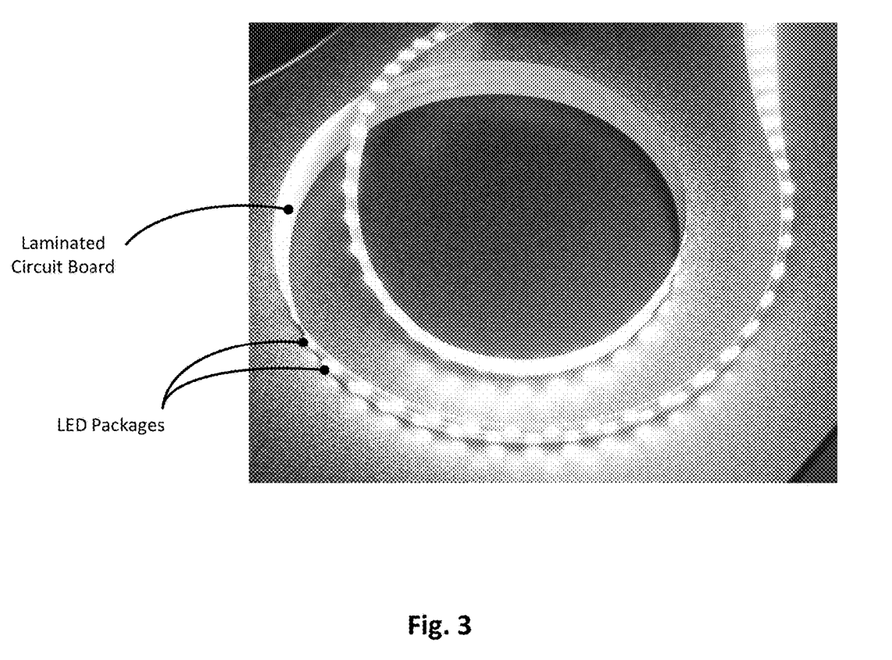
FIG. 3 illustrates an example flexible laminated LED circuit including two LED strings connected in parallel, according to an embodiment of the present invention.

FIG. 3 illustrates an example flexible laminated LED circuit including two LED strings connected in parallel, according to an embodiment of the present invention. As can be seen in this example embodiment, two strings of LED packages have been connected in series along conductive wires to form a flexible LED circuit. This particular example illustrates the flexibility of such a laminated LED circuit.

Figure 4A:
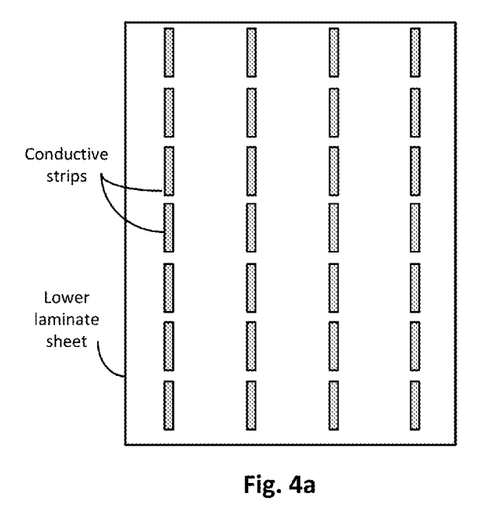
FIGS. 4a-d collectively illustrate the formation of a flexible laminated circuit board, according to an embodiment of the present invention.
Figure 4B:
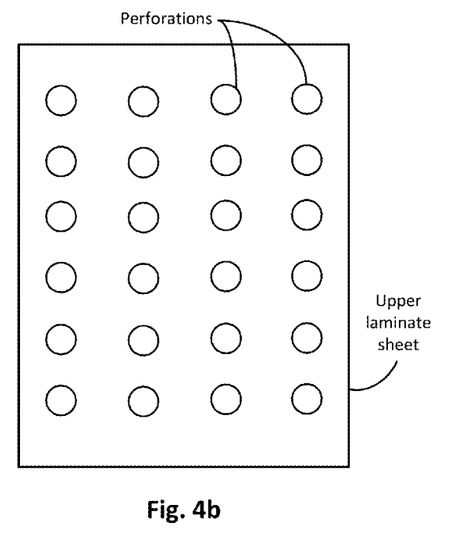
Figure 4C:
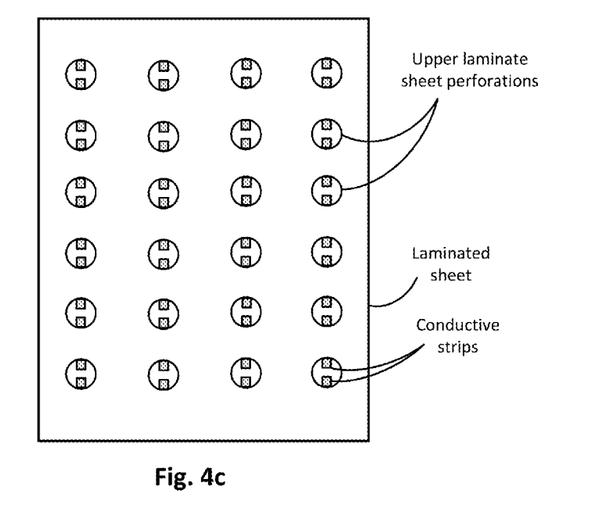
Figure 4D:
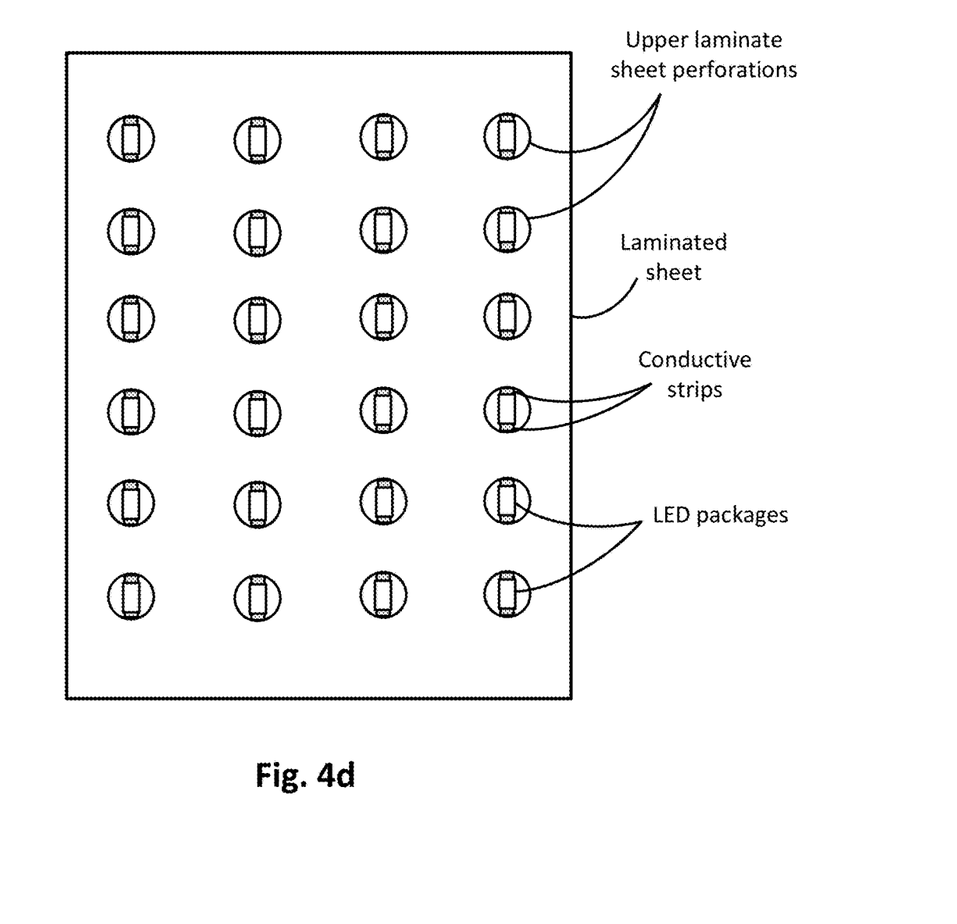

FIGS. 4a-d collectively illustrate the formation of a flexible laminated circuit board, according to an embodiment of the present invention. FIG. 4a shows an example of a lower laminate sheet with four columns of conductive strips. The conductive strips are spaced such that LED packages may be attached at the spaces between strips, thus forming four LED strings. The conductive strips could be, for example, sections of copper ribbon, wires, or any other conductive material suitable for depositing LED packages. FIG. 4b shows an example upper laminate sheet with multiple perforations matching the location of the spaces between the conductive strips. FIG. 4c shows an example of a laminated circuit board after the lower laminate sheet of FIG. 4a and the upper laminate sheet of FIG. 4b are laminated together. In this particular example, the upper laminate sheet is not transparent, such that the conductive strips are only visible at the perforations. As can be seen in this example, the perforations expose the spaces between the conductive strips, and an LED circuit package may be soldered or otherwise attached across these spaces. FIG. 4d shows an example of a laminated circuit board after LED packages have been attached across the spaces between the conductive strips, according to an embodiment of the present invention.

Figure 5A:
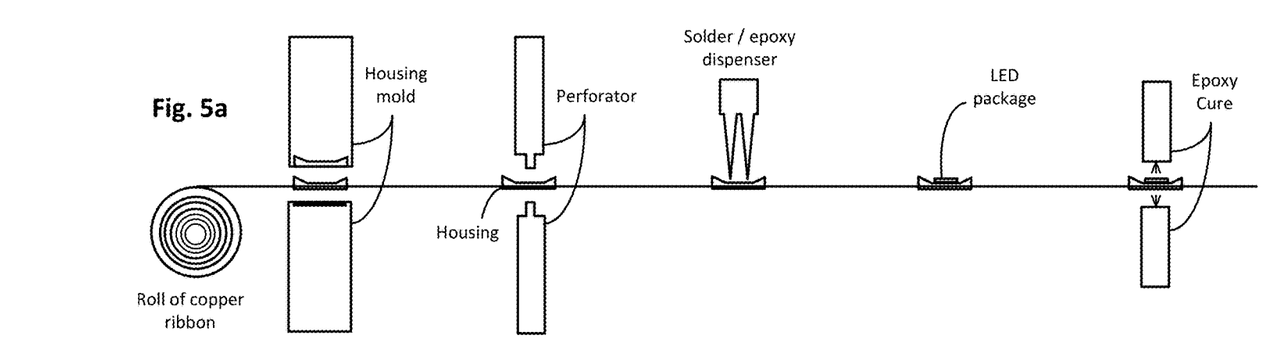
FIGS. 5a-c collectively illustrate the formation of a string of LED packages surrounded by plastic housings, according to an embodiment of the present invention.
Figure 5B:
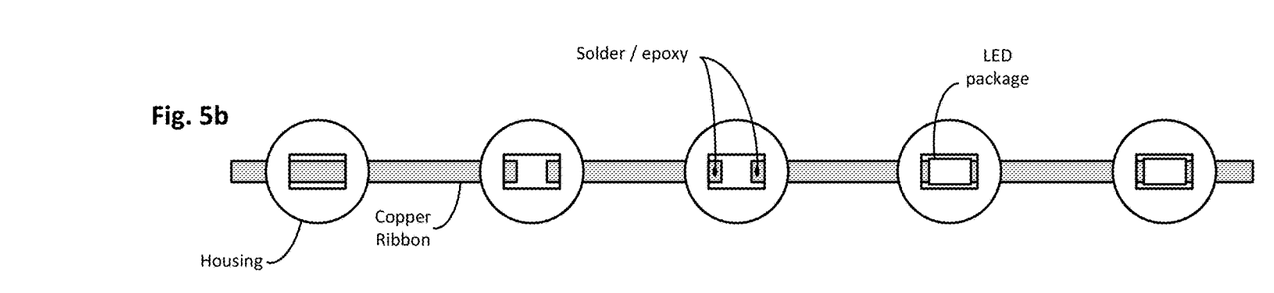
Figure 5C:
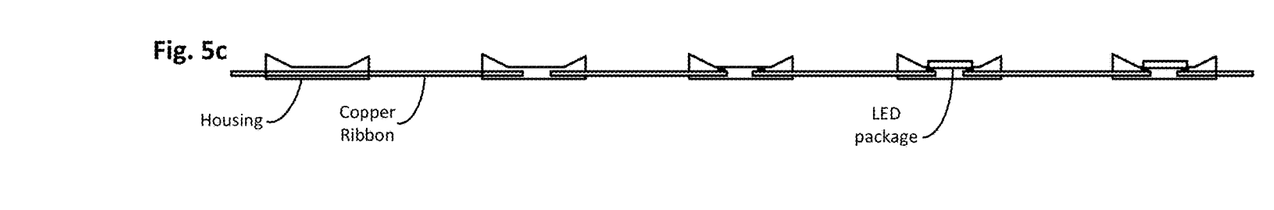

FIGS. 5a-c collectively illustrate the formation of a string of LED packages surrounded by plastic housings, according to one embodiment of the present invention. FIGS. 5a and 5c show various cross-sectional views of the formation of the plastic housing and attachment of an LED package, while FIG. 5b shows a view from above of the formation of the plastic housing and attachment of an LED package, according to an embodiment of the present invention. In the example shown in FIG. 5a, a length of copper ribbon is dispensed from a roll. As can be seen in these figures, a housing mold forms a plastic housing around the copper ribbon and a perforator cuts the copper ribbon. In one embodiment, the plastic housing is made from a reflective polymer. The housings may have a hole in the center and may resemble a ring when completed, in some embodiments. The perforator could be a hole-punching mechanism similar to the one shown, one or more precision blades, or any other device for cutting the copper ribbon and providing two pads for the placement of the anode and cathode leads of the LED packages. In some embodiments, once the ribbon is perforated, solder or epoxy may be dispensed on the exposed ends of the copper ribbon within the plastic housing and an LED package may be deposited onto the copper ribbon. In the embodiments where a conductive epoxy is used to attach the LED packages, an epoxy curer may cure the epoxy in order to fully attach the LED package.

Figure 6:
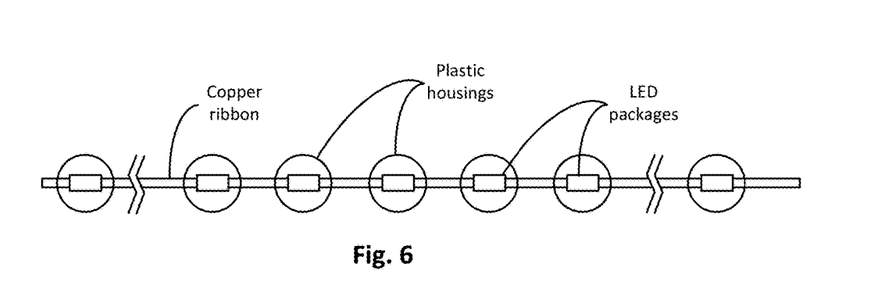
FIG. 6 shows a string of LED packages attached to a copper ribbon within plastic housings, according to an embodiment of the present invention.

FIG. 6 shows a string of LED packages attached to a copper ribbon within plastic housings, according to one embodiment of the present invention. In some embodiments, many LED packages may be fabricated in a single long string, and the string can be cut to any desired length or number of LED packages. The desired length and number of LED packages in each string may be dependent on the desired DC voltage that the lighting driver would apply across the string, in some embodiments. In this particular example, the string is cut to a string of five LED packages for the eventual placement within a flexible laminated circuit board. Once the strips are cut to length, they may be attached or laminated to a piece of flexible material (e.g., PET), in some embodiments. In one example, the plastic housing is reflective and little photometric performance is lost if the flexible substrate is clear.

Figure 7:
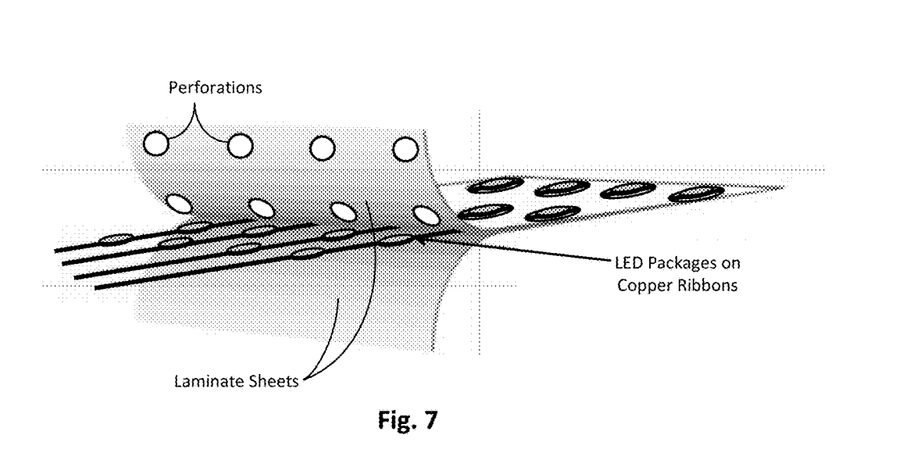
FIG. 7 shows four strings of LED packages on copper ribbons being laminated between two laminate sheets, according to an embodiment of the present invention.

FIG. 7 shows four strings of LED packages on copper ribbons being laminated between two laminate sheets, according to an embodiment of the present invention. Once multiple strings of LED packages have been formed on copper ribbons (e.g., as described in reference to FIGS. 5a-6), they may be laminated to form a flexible laminated LED circuit. In this particular example, the upper laminate sheet includes perforations so that the upper laminate sheet does not cover the LED packages on the copper ribbons. As can be seen, the perforations in this example are circular; however, they may be oval, rectangular, or any other suitable shape, in other embodiments. In one example embodiment, the upper laminate sheet is a transparent plastic such as polyethylene terephthalate (PET), or other suitable polymer, while the lower laminate sheet has a reflective upper surface. In other embodiments, the upper laminate sheet may have a reflective upper surface. Although this particular example shows four strings of LED packages laminated between two sheets, other embodiments may include fewer or more strings of LED packages and the copper ribbons may be replaced with copper wires, or any other suitable conductive material.

Methodology

Figure 8:
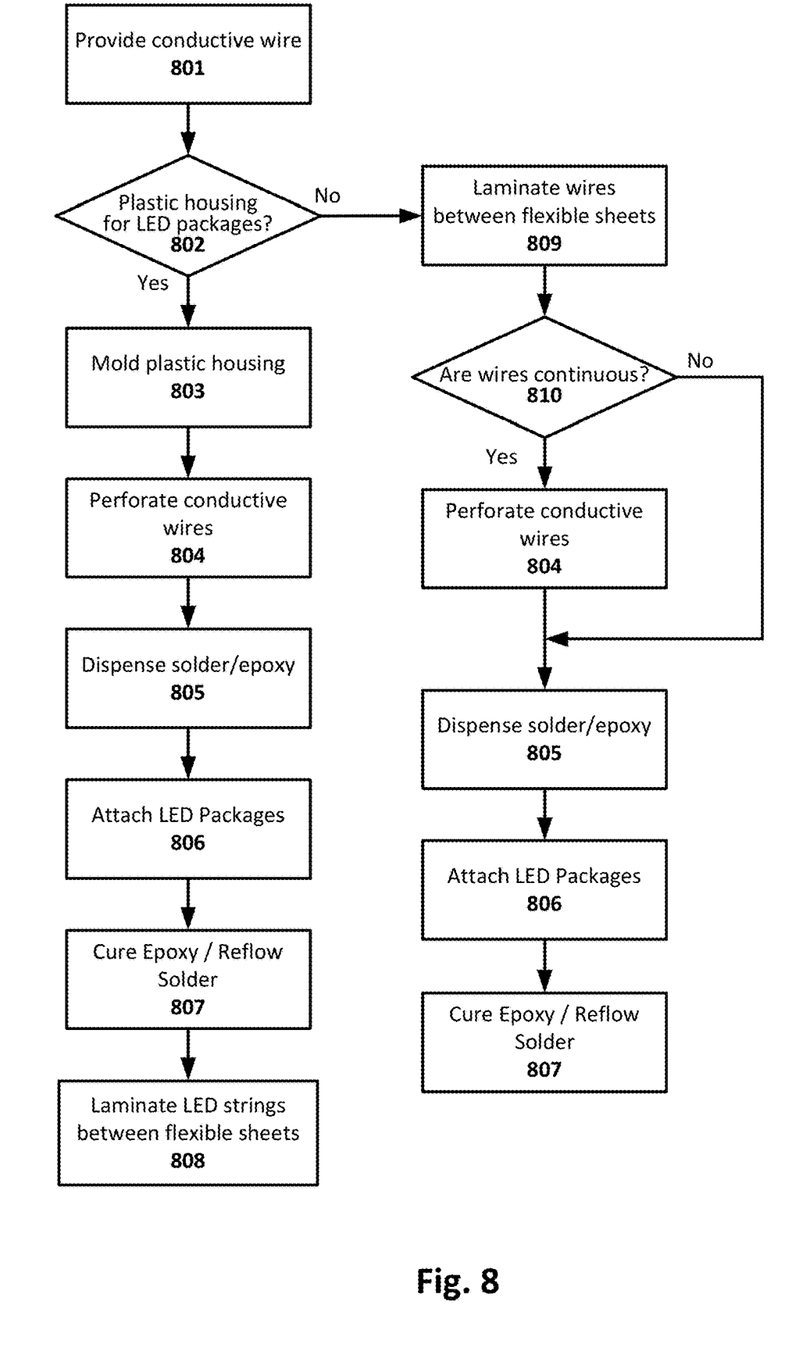
FIG. 8 illustrates a method for fabricating a flexible laminated LED circuit, according to an embodiment of the present invention.

FIG. 8 illustrates a method for fabricating a flexible laminated LED circuit, according to an embodiment of the present invention. The method may begin with providing 801 at least one conductive wire. In some embodiments, the conductive wire may be a copper ribbon, copper wire, a number of strips of copper ribbon or copper tape, or any other suitable section of conductive material. The method may continue with determining 802, whether a plastic housing will be formed around the conductive wire for the placement of the LED packages. If a plastic housing will be formed for the LED packages, the method may continue with molding 803 one or more plastic housings around the conductive wire in the locations where the LED packages are to be attached. The method may continue with perforating 804 the conductive wire within the plastic housings, thus providing a location for the placement of the LED packages. As discussed above, the perforations may be made using various metal cutting techniques, and the plastic housings in such embodiments hold the conductive wire together after the perforations are made. The method may continue with dispensing 805 solder or epoxy on the ends of the conductive wire where the perforations have been made. The method may continue with attaching 806 the LED packages to the conductive wire. As discussed above, the LED packages may be attached to the conductive wire using solder or conductive epoxy. The method may continue with curing 807 the epoxy or reflowing the solder, depending on which adhesion technique is used. The method may continue with laminating 808 the LED strings between flexible laminate sheets. In some embodiments, one or more strings of LED packages may be fabricated at once and these strings may be of various lengths and may include the same, more, or fewer LED packages. In some embodiments, the strings of LED packages may be cut to a uniform size before being laminated between the laminate sheets.

If it is determined at 802 that no plastic housing is to be formed for the LED packages, the method may continue with laminating 809 the conductive wires between the flexible laminate sheets. As discussed above, the conductive wire may be a length of copper ribbon, multiple sections of conductive ribbon or conductive tape, a copper wire, or some other suitable conductive material. The upper sheet of the laminating material may include multiple perforations that expose sections of the conductive wires for the eventual placement of LED packages. The method may continue with determining 810 whether the wires are continuous. In some embodiments, the conductive wires are continuous lengths of conductive material, which must be perforated or otherwise cut prior to attaching the LED packages. In other embodiments, the conductive wires are sections of conductive material that are spaced within the laminated sheet for the eventual placement of LED packages. If the wires are continuous, the method may continue with perforating 804 the conductive wires as discussed above. After the wires are perforated, or if the wires are not continuous, the method may continue with dispensing 805 solder or epoxy, attaching 806 the LED packages, and curing 807 the epoxy or reflowing the solder as discussed above.

Numerous embodiments will be apparent, and features described herein can be combined in any number of configurations. One example embodiment of the present invention provides a flexible circuit. The circuit includes a perforated upper laminate sheet; a lower laminate sheet; a plurality of metallic conductors laminated between the perforated upper laminate sheet and the lower laminate sheets, wherein the metallic contacts of the conductors are exposed by perforations in the perforated upper laminate sheet; and a plurality of surface mount devices attached to the metallic contacts. In some cases, the plurality of surface mount devices includes a plurality of LED packages. In some such cases, the plurality of LED packages is attached to the metallic conductors in at least two series strings connected in parallel. In some such cases, the plurality of LED packages is attached to the metallic conductors in a string formation. In some cases, at least one of the perforated upper laminate sheet and/or the lower laminate sheet has a reflective surface. In some cases, the plurality of surface mount devices is attached to the metallic contacts using solder or conductive epoxy. In some cases, the metallic conductors include at least one of a metallic ribbon, a metallic tape, and/or a metallic wire.

Another embodiment of the present invention provides a method of fabricating a flexible circuit. The method includes perforating an upper laminate sheet; laminating metallic conductors between the upper laminate sheet and a lower laminate sheet, wherein the perforations of the upper laminate sheet expose portions of the conductors; perforating the exposed portions of the metallic conductors; and attaching a plurality of LED packages across the perforated portions of the metallic conductors. In some cases, at least one of the perforated upper laminate sheet and/or the lower laminate sheet has a reflective surface. In some cases, perforating the metallic conductors includes at least one of punching a hole across the exposed conductors and/or cutting away a section of the exposed conductors. In some cases, attaching the LED packages includes attaching the LED packages with solder or conductive epoxy. In some cases, the LED packages are attached with a conductive epoxy, and the method further includes curing the epoxy. In some cases, the LED packages are attached to the metallic conductors forming at least two series strings of LED packages.

Another embodiment of the present invention provides a method of fabricating a flexible circuit. The method includes molding a plurality of plastic housings around a metallic conductor, wherein a portion of the conductor is exposed within the plastic housings. The method also includes perforating the exposed portions of the metallic conductor; forming a string of LED packages by attaching a plurality of LED packages across perforated portions of the metallic conductor; and laminating the string of LED packages between a lower laminate sheet and a perforated upper laminate sheet, wherein perforations in the upper laminate sheet leave the LED packages exposed. In some cases, perforating the metallic conductors includes punching a hole across the exposed conductors and/or cutting away a section of the exposed conductors. In some cases, metallic conductors include at least one of a metallic ribbon, a metallic tape, and/or a metallic wire. In some cases, the method includes cutting the string of LED packages to a desired length prior to laminating the string of LED packages. In some such cases, the length of the LED package strings is determined by the desired DC voltage drop across the strings. In some cases, attaching the LED packages includes attaching the LED packages to the conductive wire using solder or conductive epoxy. In some cases, the plastic housings are molded from a reflective polymer material.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A flexible circuit comprising:
    a perforated upper laminate sheet formed of polymeric material;
    a lower laminate sheet formed of polymeric material;
    a plurality of metallic conductors laminated between the perforated upper laminate sheet and the lower laminate sheet, wherein metallic contacts of the conductors are exposed by perforations in the perforated upper laminate sheet;
    wherein each metallic conductor comprises at least one of a metallic ribbon, a metallic tape, and/or a metallic wire;
    wherein each metallic conductor provides two metallic contacts at opposing ends thereof, and each metallic conductor extends between adjacent perforations;
    wherein each metallic conductor is clampingly retained between the upper and lower laminate sheets; and
    a plurality of surface mount devices attached to the metallic contacts of two adjacent metallic conductors.

2. The circuit of claim 1 wherein the plurality of surface mount devices comprise a plurality of LED packages.

3. The circuit of claim 2 wherein the plurality of LED packages are attached to the metallic conductors in at least two series strings connected in parallel.

4. The circuit of claim 3 wherein the plurality of LED packages are attached to the metallic conductors in a string formation.

5. The circuit of claim 1 wherein at least one of the perforated upper laminate sheet and/or the lower laminate sheet has a reflective surface.

6. The circuit of claim 1 wherein the plurality of surface mount devices are attached to the metallic contacts using solder or conductive epoxy.

7. A method of fabricating a flexible circuit comprising:
    perforating an upper laminate sheet formed of polymeric material;
    laminating a metallic conductor strip between the upper laminate sheet and a lower laminate sheet to clampingly retain the metallic conductor strip between the upper and lower laminate sheets, the lower laminate sheet being formed of polymeric material, wherein the perforations of the upper laminate sheet expose portions of the conductor strip;
    perforating the exposed portions of the metallic conductor strip to form a plurality of metallic conductors, whereby each metallic conductor provides two metallic contacts at opposing ends thereof, and each metallic conductor extends between adjacent perforations in the upper laminate sheet; and
    attaching a plurality of LED packages across respective said perforated portions of the metallic conductor strip at said metallic contacts.

8. The method of claim 7 wherein at least one of the perforated upper laminate sheet and/or the lower laminate sheet has a reflective surface.

9. The method of claim 7 wherein perforating the metallic conductors comprises at least one of punching a hole across the exposed conductors and/or cutting away a section of the exposed conductors.

10. The method of claim 7 wherein attaching the LED packages comprises attaching the LED packages with solder or conductive epoxy.

11. The method of claim 10 wherein the LED packages are attached with a conductive epoxy, and wherein the method further comprises curing the epoxy.

12. The method of claim 7 wherein the LED packages are attached to the metallic conductors forming at least two series strings of LED packages.

13. A method of fabricating a flexible circuit comprising:
    molding a plurality of plastic housings around a metallic conductor strip, wherein a portion of the conductor is exposed within the plastic housings;
    perforating the exposed portions of the metallic conductor strip to form a plurality of metallic conductors, whereby each metallic conductor provides two metallic contacts at opposing ends thereof, and each metallic conductor extends between adjacent plastic housings;
    forming a string of LED packages by attaching a plurality of LED packages across respective said perforated portions of the metallic conductor strip at said metallic contacts; and
    laminating the string of LED packages between a lower laminate sheet formed of polymeric material and a perforated upper laminate sheet formed of polymeric material, thereby clampingly retaining the metallic conductors between the upper and lower laminate sheets, whereby each metallic conductor extends between adjacent perforations in the upper laminate sheet and wherein perforations in the upper laminate sheet leave respective said LED packages exposed.

14. The method of claim 13 wherein perforating the metallic conductors comprises at least one of punching a hole across the exposed conductors and/or cutting away a section of the exposed conductors.

15. The method of claim 13 wherein the metallic conductors comprise at least one of a metallic ribbon, a metallic tape, and/or a metallic wire.

16. The method of claim 13 further comprising cutting the string of LED packages to a desired length prior to laminating the string of LED packages.

17. The method of claim 16 wherein the length of the LED package strings is determined by the desired DC voltage drop across the strings.

18. The method claim 13 wherein attaching the LED packages comprises attaching the LED packages to the conductive wire using solder or conductive epoxy.

19. The method of claim 13 wherein the plastic housings are molded from a reflective polymer material.

* * * * *